US011137896B2

United States Patent
Brockmole (10) Patent No.: US 11,137,896 B2
(45) Date of Patent: Oct. 5, 2021

(54) SYSTEM AND METHOD FOR DETERMINING A LOCATION OF A USER RELATIVE TO A USER INTERFACE FOR CONTEXTUAL CONTROL

(71) Applicant: Harman International Industries, Incorporated, Stamford, CT (US)

(72) Inventor: Jeffrey Michael Brockmole, Brighton, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 16/717,619

(22) Filed: Dec. 17, 2019

(65) Prior Publication Data
US 2021/0181910 A1    Jun. 17, 2021

(51) Int. Cl.
| | |
|---|---|
| *G06F 1/3231* | (2019.01) |
| *G06F 3/0488* | (2013.01) |
| *G06F 3/041* | (2006.01) |
| *B60K 37/06* | (2006.01) |
| *H03K 17/96* | (2006.01) |
| *B60K 35/00* | (2006.01) |
| *B60K 37/02* | (2006.01) |

(52) U.S. Cl.
CPC ............ *G06F 3/0488* (2013.01); *B60K 35/00* (2013.01); *B60K 37/02* (2013.01); *B60K 37/06* (2013.01); *G06F 3/0412* (2013.01); *G06F 3/04186* (2019.05); *H03K 17/962* (2013.01); *B60K 2370/164* (2019.05)

(58) Field of Classification Search
CPC ........ G06F 3/041–0428; G06F 3/0488–04886; G06F 2203/04103–04113
See application file for complete search history.

(56) References Cited

U.S. PATENT DOCUMENTS

| | | | |
|---|---|---|---|
| 9,467,515 B1 * | 10/2016 | Penilla | G06F 3/04845 |
| 2011/0043489 A1 * | 2/2011 | Yoshimoto | G06F 3/0416 345/175 |
| 2018/0157329 A1 * | 6/2018 | Salter | G06F 3/017 |
| 2019/0179527 A1 | 6/2019 | Channey et al. | |

\* cited by examiner

*Primary Examiner* — Sanghyuk Park
(74) *Attorney, Agent, or Firm* — Brooks Kushman P.C.

(57) ABSTRACT

In at least one embodiment, a system is provided that includes a user interface, a plurality of proximity sensors, and at least one controller. The user interface is configured to enable selection of one or more operations for a vehicle. The plurality of proximity sensors is positioned about or within the user interface and is configured to transmit first signals indicative of a location of a user relative to the user interface as the user selects the one or more operations for the vehicle with the user interface. The at least one controller is configured to determine the location of the user relative to the user interface in response to the first signals and to transmit a vehicle control signal to a vehicle subsystem to perform the one or more operations based on the location of the user relative to the user interface.

17 Claims, 6 Drawing Sheets

SYSTEM AND METHOD FOR DETERMINING A LOCATION OF A USER RELATIVE TO A USER INTERFACE FOR CONTEXTUAL CONTROL

TECHNICAL FIELD

Aspects disclosed herein generally relate to a system and method for determining a location of a user relative to a user interface to provide contextual control. These aspects and others will be discussed in more detail below.

BACKGROUND

U.S. Publication No. 2019/0179527 to Channey et al. provides touch control devices and surface wrapped control interfaces for vehicles. In one embodiment, a touch control device includes a housing assembly including an outer surface, and a touch sensor mounted to an inner surface of the housing assembly. The touch sensor includes at least one touch zone and is configured to detect contact to the outer surface of the housing assembly associated with the at least one touch zone. The touch control device may also include at least one illumination element to illuminate a portion of the outer surface of the housing assembly associated the at least one touch zone and a controller configured to illuminate at least one illumination element in response to contact with a touch zone. The touch control device can output a control signal in response to contact with the at least one touch zone.

SUMMARY

In at least one embodiment, a system is provided that includes a user interface, a plurality of proximity sensors, and at least one controller. The user interface is configured to enable selection of one or more operations for a vehicle. The plurality of proximity sensors is positioned about or within the user interface and is configured to transmit first signals indicative of a location of a user relative to the user interface as the user selects the one or more operations for the vehicle with the user interface. The at least one controller is configured to determine the location of the user relative to the user interface in response to the first signals and to transmit a vehicle control signal to a vehicle subsystem to perform the one or more operations based on the location of the user relative to the user interface.

In at least another embodiment, a method is provided that includes enabling a selection of one or more operations for a vehicle at a user interface and transmitting first signals indicative of a location of a user relative to the user interface via a plurality of proximity sensors as a user selects the one or more operations for the vehicle with the user interface. The method further includes determining a location of the user relative to the user interface via at least one controller in response to the first signals and transmitting a vehicle control signal to a vehicle subsystem with the at least one controller to perform the one or more operations based on the location of the user relative to the user interface.

In at least another embodiment, a system including a user interface, a plurality of proximity sensors, and at least one controller. The user interface is configured to enable selection of one or more operations. The plurality of proximity sensors is positioned about or within the user interface and is configured to transmit first signals indicative of a location of a user relative to the user interface as the user selects the one or more operations with the user interface. The at least one controller is configured to determine the location of the user relative to the user interface in response to the first signals and to transmit a control signal to a first controller to perform the one or more operations based on the location of the user relative to the user interface.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It is recognized that the controller(s) as disclosed herein may include various microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, such controllers as disclosed utilize one or more microprocessors to execute a computer-program that is embodied in a non-transitory computer readable medium that is programmed to perform the functions as disclosed. Further, the controller(s) as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware-based inputs and outputs for transmitting and receiving data, respectively, to and from other hardware-based devices as discussed herein.

It is generally desirable to determine a location of a user relative to a user interface to provide contextual control based on the location (or further based on an associated identity of the user based on the location). For example, a touch screen and/or other user interfaces play a vital role in enabling drivers and passengers the ability to control various operations in a vehicle. These touch screens and/or user interfaces may be a distraction for drivers. Various vehicle operations may not be available or may be disabled while the vehicle is in motion. Such a disabling of vehicle operations may be a source of annoyance for vehicle passengers who are not driving the vehicle.

Aspects disclosed herein generally provide, but not limited to, the ability to determine whether a driver or a passenger has selected a particular option on a vehicle touch screen or selected a particular user interface (e.g., rotary knob, slider, etc.) on the vehicle and control a vehicle operation based on whether the vehicle occupant is a driver or a passenger. It is also recognized that the embodiments as set forth herein may not be used only for vehicle applications but for other application in which it is desirable to understand the location of a user relative to a user interface. In one example, by determining a slope of an axis defined in a single depressed fingertip on a touchscreen, it is possible to determine a relative location of the user and infer whether the user is a driver or a passenger. For example, a user's fingertip flattens as contact is made with a solid object. Such a flattening of the fingertip may provide an ovular shape to for various touch sensors behind a rigid screen of the touch screen. Ovals have unique length versus width which facilitates drawing of an X and Y axis through the variable finger location. By comparing this aspect to the stable X and Y axis of a fixed screen, the disclosed system may determine the location of the user relative to the touch screen. For example, if the user is on the left side of the screen, the shape of the touch response may be +45 degrees from vertical. If instead the user is on the right side, the angle would be −45 degrees.

It may also be possible to implement this aspect via proximity sensors that are positioned around (or that surround) the touch screen. If a majority of a user's hand is detected in a left area of the touchscreen, the system may then determine that the touch or selection on the touch screen is from a user positioned on a left-side. Alternatively, if the majority of the user's hand is detected in the right area of the touchscreen, the system may determine that the touch of selection on the touch screen is from a user positioned on a right-side.

Figure 1:
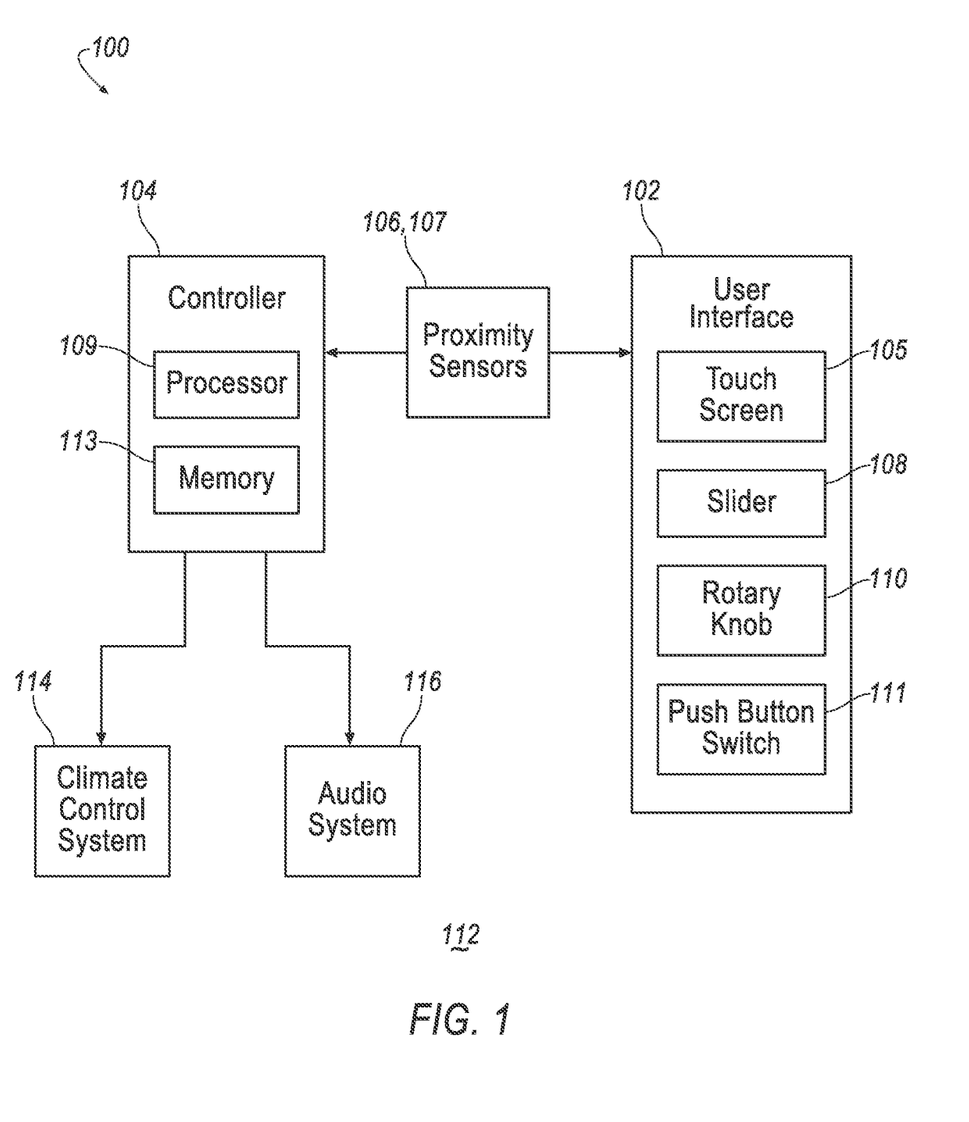
FIG. 1 depicts a system for determining a location of a user relative to a user interface to provide contextual control in accordance to one embodiment.

FIG. 1 depicts a system 100 for detecting a relative location of a user at a user interface 102 to provide contextual control in accordance to one embodiment. The system 100 includes at least one controller 104 (hereafter "controller 104") and a plurality of proximity sensors 106. The proximity sensors 106 are electrically coupled to the user interface 102 and provide signals indicative of a desired operation to be performed in response to a selection by a user on the user interface to the controller 104. The user interface 102 may correspond to, for example, a touch screen 105, a slider 108, a rotary knob 110, and/or a push button switch 111. It is recognized that the user interface 102 may correspond to other types of sensory devices that require an actuation by a user in order to elicit a desired operation.

In one example, the system 100 may be implemented in a vehicle 112 and the controller 104 may control various vehicle operations related to a climate control system 114 and an audio system 116 in the vehicle 112. The user interface 102 may be associated with any vehicle subsystem, such as for example, the climate control system 114 or the audio system 116 for controlling aspects related to these systems 114, 116. The controller 104 is configured to determine a position of the user relative to the user interface 102 and to perform an operation based on the location of the user relative to the user interface 102. For example, the controller 104 may determine that the user is positioned on a left side of the user interface 102 based on the signals provided by the proximity sensors 106. In this case, the controller 104 may determine that the user is a driver since the user is positioned to the left of the user interface 102 and provide control signals to the climate control system 114 or the audio system 116 to perform operations that are specific for the driver. Similarly, the controller 104 may determine that the user is a passenger positioned in a front row of the vehicle 112 since the user may be positioned to the right of the user interface 102. In this case, the controller 104 may determine that the user is a passenger since the user is positioned to the right of the user interface 102 and provide control signals to the climate control system 114 or the audio system 116 to perform operations that are specific for the passenger. The controller 104 includes memory 113 and at least one processor 109 (hereafter "the processor 109") to perform the various operations as set forth herein.

All references to the user being positioned to either the left side or the right side of the user interface 102 corresponds to the user being positioned in a driver seat or front row passenger seat, respectively, in the vehicle 112. It is recognized that the location of the user relative to the user interface 102 may extend to other locations in the vehicle (e.g., distinguishing or ascertaining the location of passengers in rear row seating), etc.

In response to determining the location of the user relative to the user interface 102, the controller 104 may control various vehicle subsystems (e.g., the climate control system 114 and/or the audio system 116) to perform operations that are specific to for the user. For example, in the event the user is detected to be a passenger based on the detected location of the user relative to the user interface 102 of the climate control system 114 (e.g., a dual zone climate control system) and the user inputs a change in temperature at the user interface 102, the controller 104 may control the climate control system 114 to adjust the temperature on the passenger side of the vehicle 112 to effectuate the desired temperature change. Likewise, in the event the user is detected to be a driver based on the detected location of the user relative to the user interface 102 of the climate control system 114 (e.g., a dual zone climate control system) and the user inputs a change in temperature at the user interface 102, the controller 104 may control the climate control system 114 to adjust the temperature on the driver side of the vehicle 112 to effectuate the desired temperature change.

Similarly, the audio system 116 may perform specific operations for the driver and the passenger based on whether the driver selects an audio related system option at the user interface 102 at the audio system 116 or whether the passenger selects an audio related system option at the user interface 102. For example, the audio system 116 may perform independent volume control for the driver and the passenger. Additionally, the audio system 116 may also provide independent media source selection for the driver and the passenger.

For any vehicle operations that are generally disabled for the driver, the controller 104 may transmit control signals to a particular vehicle subsystem to perform the operation upon detecting that the user who selected the vehicle operation at the user interface is a passenger. In the event the controller 104 determines that the user is the driver and that the driver is seeking to have a vehicle operation performed that may be disabled in an effort to reduce driver distraction, the controller 104 in this case may ignore the request or selection performed at the user interface 102.

Figure 2:
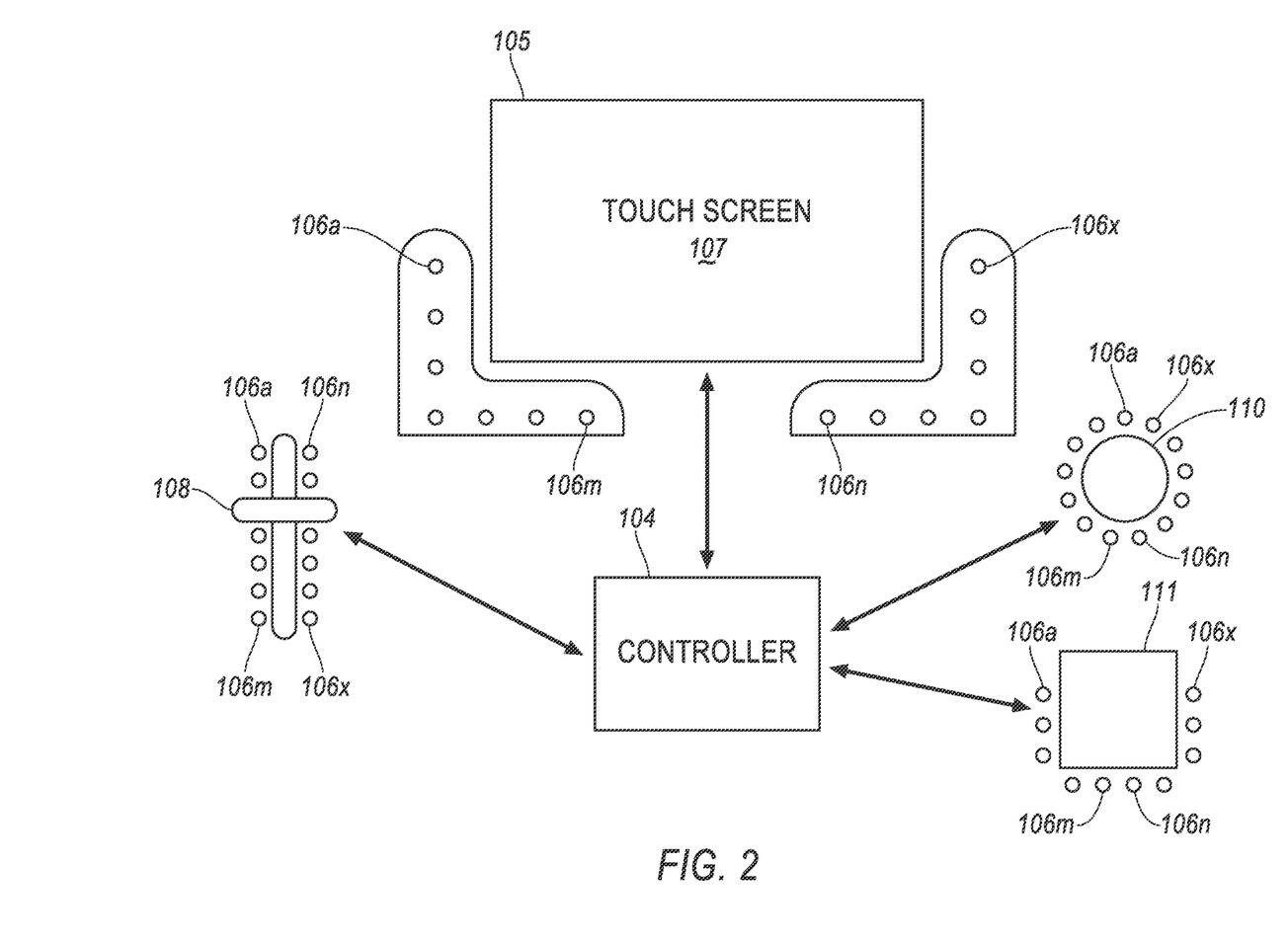
FIG. 2 depicts a more detailed implementation of the system in accordance to one embodiment.

FIG. 2 depicts a more detailed implementation of the system 100 in accordance to one embodiment. In reference to the touch screen 105, the proximity sensors 106a-106m may be positioned on left side thereof and the proximity sensors 106n-106x may be positioned on a right side thereof. The proximity sensors 106a-106x are generally arranged to the left and to the right to detect the direction of a user's hand relation to the touch screen 105 as the user's hand approaches the touch screen 105 to select a various operation displayed on the screen 105. Various proximity sensors 107 may also be positioned within the touch screen 105. The proximity sensors 106a-106n may include capacitive sensors, inductive sensors, or photoelectric sensors or any combination thereof. The proximity sensors 107 may be implemented as capacitive sensors.

Referring back to the proximity sensors 106a-106x as situated or positioned around an outer perimeter of the touch screen 105, the proximity sensors 106a-106x transmit signals indicative of whether a user's hand/or wrist has been detected to the controller 104. In turn, the controller 104 may determine that the user is the driver if the signals are indicative of the user's hand or wrist being detected to the left of the touch screen 105 by any one or more of the proximity sensors 106a-106m. Likewise, the controller 104 may determine that the user is a passenger if the signals are indicative of the user's hand or wrist being detected to the right of the touch screen 105 by any one or more of the proximity sensors 106n-106x.

In reference to the slider 108, the proximity sensors 106a-106m may be positioned to on the left side of the slider 108 and the proximity sensors 106n-106m may be positioned on the right side of the slider 108. The controller 104 may infer or determine whether the user that toggles the slider 108 may be a driver if the proximity sensors 106a-106m first detects a user's finger to the left of the slider 108. In this example, the driver's thumb may be the first finger to come into contact with the left side of the slider 108 followed by one or more finger contacts with the right side of the slider 108. Similarly, the controller 104 may infer or determine whether the user that toggles the slider 108 may be a passenger if the proximity sensors 106n-106x detect a user's finger to the right of the slider 108. In this example, the passenger's thumb may be the first finger to come into contact with the right side of the slider 108 followed by one or more finger contacts with the left side of the slider 108. This aspect will be discussed in more detail in connection with FIG. 5. The same methodology may apply to the rotary knob 110. This will also be discussed in more detail in connection with FIG. 5.

It is also recognized that the slider 108 may comprise of a touch sensitive bar on the touch screen that appears as a graphic and that further enables a user to slide their respective finger on the bar on the touch screen 105 or display. With this example, the proximity sensors 107 may be positioned within the touch screen 105. The methodology noted directly above may still apply to the manner in which the controller 104 determines the location of the user relative to the touch screen 105.

In reference to the push button switch 111, the manner in which the driver or passenger may be determined by the controller 104 as noted above in connection with the touch screen 105 may be similar. For example, the controller 104 may determine that the user is the driver if the signals from the proximity sensors 106a-106m are indicative of the user's fingers being detected to the left of the push button switch 111. Likewise, the controller 104 may determine that the user is a passenger if the signals from the proximity sensors 106a-106m are indicative of the user's fingers being detected to the right of the push button switch 111.

Figure 3:
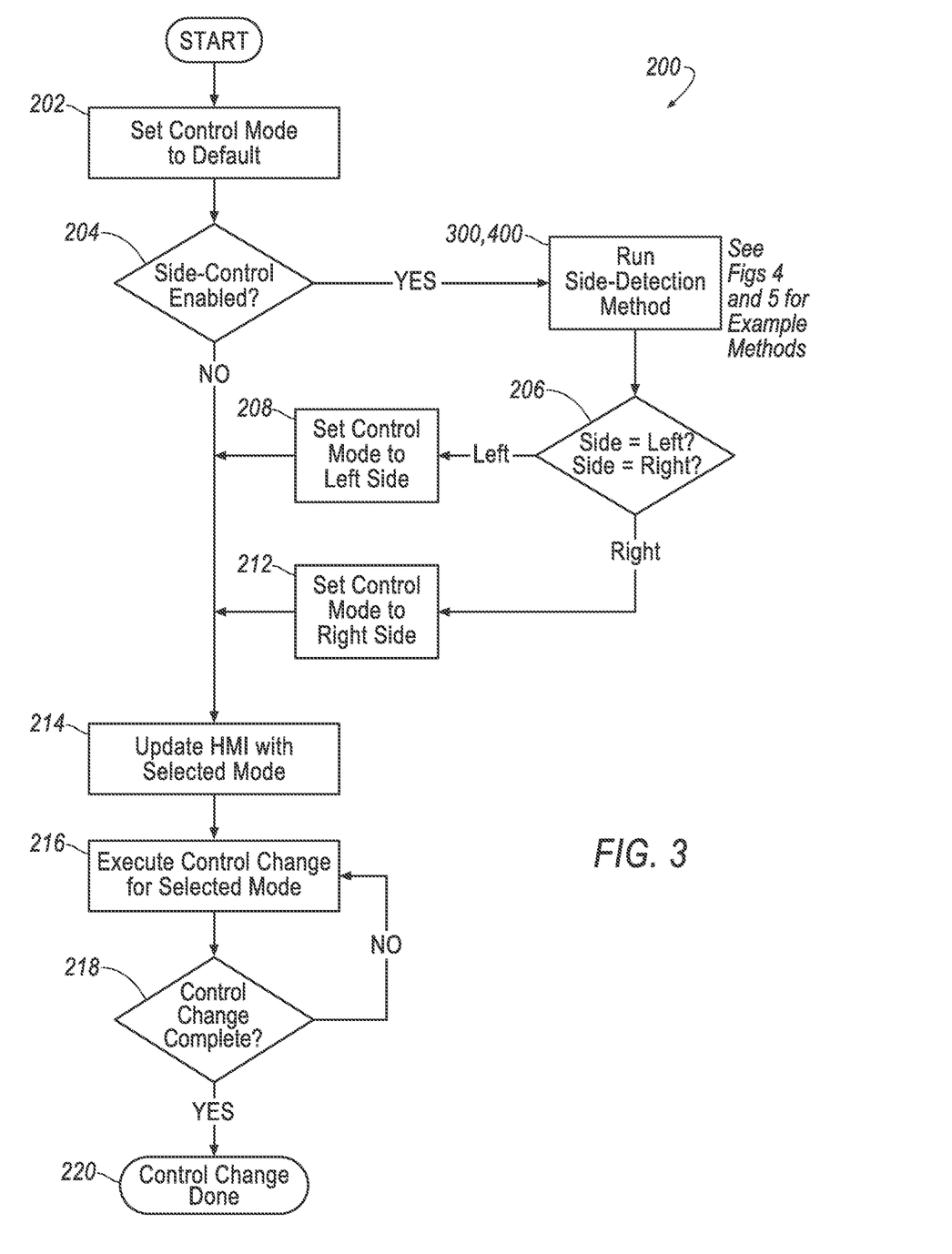
FIG. 3 depicts a first method for determining a location of a user relative to a user interface and for executing an operation based on the location of the user relative to the user interface in accordance to one embodiment.

FIG. 3 depicts a first method 200 for determining a location of a user relative to a user interface and for executing an operation based on the location of the user relative to the user interface in accordance to one embodiment. The first method 200 generally corresponds to a general use case in which the controller 104 determines the location of the user relative to the various user interfaces 102.

In operation 202, the controller 104 defaults into a default mode in which it is not known whether a driver or a passenger has selected a vehicle operation via a particular user interface 102. For example, for dual zone temperature control, the controller 104 in this operation has no knowledge of which vehicle occupant is controlling the temperate control for the climate control system 114.

In operation 204, the controller 104 determines whether side control is enabled for the user interface 102 at the moment of control action. For example, the controller 104 may determine that side control of the user interface 102 is temporarily disabled based on usage context. Consider the example of a volume knob, such a knob may have a unique driver versus passenger control disabled in certain situations. In this case, the volume knob may operate without the need to identify whether the user is the driver or the passenger. If the controller 104 determines that side detection is available for the particular user interface 102 that is being selected, the method 200 moves to perform the operations as set forth in method 300 or 400 (see FIGS. 4 and 6). If not, the method 200 moves to operation 214. The method 300 generally corresponds to the side detection of a user relative to the touch screen 105. The method 400 generally corresponds to the side detection of a user relative to the slider 108 or the rotary knob 110. Methods 300 and 400 will be described in more detail in connection with FIGS. 4 and 6.

In operation 206, the controller 104 determines whether the selection on the user interface 102 is being made from the left side or the right side based on the operations performed in methods 300 or 400. If the selection is being performed from the left side, then the method 200 moves to operation 208. If the selection is being performed from the right side, then the method 200 moves to operation 212.

In operation 208, the controller 104 shifts the control mode form default as originally set in operation 202 to a control mode from the left side.

In operation 212, the controller 104 shifts the control mode form default as originally set in operation 202 to a control mode from the right side.

In operation 214, the controller 104 may then update the user interface 102 with the current control mode (e.g., left side or right side). In this case, the user interface 102 may provide an alert to the user notifying the user that the controller 104 and/or user interface 102 has determined the location of the user relative to the user interface 102 and that the user is either the driver (if on the left side) or the passenger (if on the right side). For example, the touch screen 105 associated with the climate control system 114 may display a prompt to the user that indicates whether the "Driver" or "Passenger" has selected a particular input on the user interface 102. Other examples may include the user interface 102 displaying a particular color for the driver or the passenger, etc. Still further, another example may include displaying a message that "Driver" control is not allowed while the vehicle is in motion.

In operation 216, the controller 104 transmits a control signal to, for example, the climate control system 114 or the audio system 116 to execute or perform the desired operation as selected by the driver or the passenger at the user interface 102.

In operation 218, the controller 104 functions as a debounce circuit and determines whether the user interface 102 is being actuated. For example, if the user is turning a volume button, it is no longer necessary to run side detection for every click of the command or selection. If the controller 104 determines that the user interface 102 is still in the process of being selected, then method 200 moves back to operation 218. If not, then the method 200 moves to operation 220.

Figure 4:
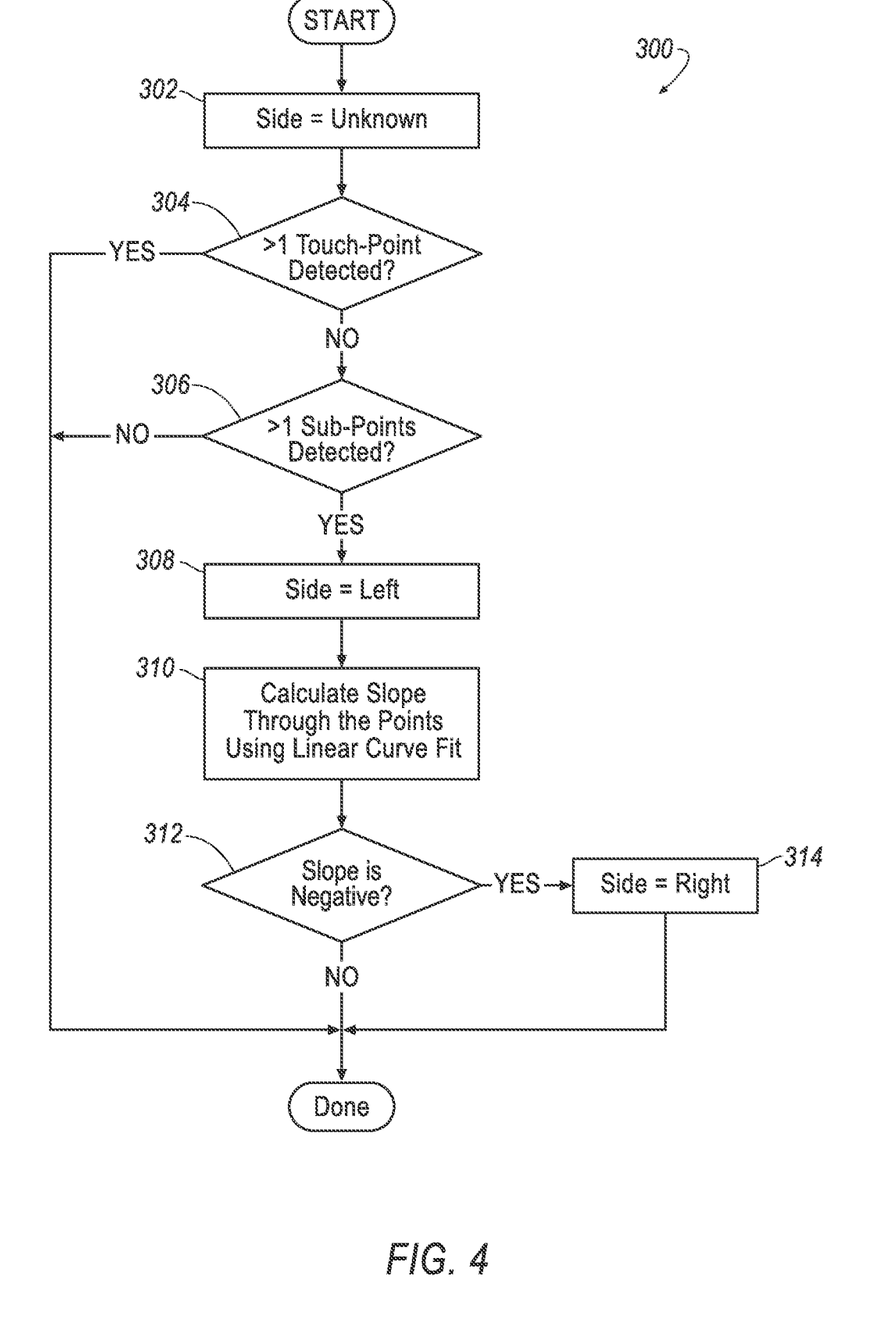
FIG. 4 depicts a second method for determining a location of a user relative to a user interface to provide contextual control in accordance to one embodiment.

FIG. 4 depicts a second method 300 for detecting a relative location of the user for a selection performed on the touch screen 105 in accordance to one embodiment.

In operation 302, the controller 104 is in a default state in which the location of the user (i.e., the side) is not yet known after a selection has been performed at the touch screen 105.

In operation 304, the controller 104 determines whether multiple touch points with multiple fingers have been detected based on the signals provided by the proximity sensors 106, 107. If multiple touch points have been detected, the controller 104 may not be able to determine the location of the user relative to the touch screen 105. In this case, the method 300 completes itself and performs the vehicle operation.

In operation 306, the controller 104 determines whether more than one subpoint has been detected. In this case, the controller 104 determines whether two points identified within a single touch on the touch screen 105 has been detected. If this condition is true, then the method 300 completes itself and performs the vehicle operation. If only a single subpoint has been detected (e.g., one point within a single touch on the touch screen 105 has been detected), then the method 300 moves to operation 308.

In operation 308, the controller 104 temporarily sets the side of the touch to the left side (e.g., to the driver side).

Figure 5:
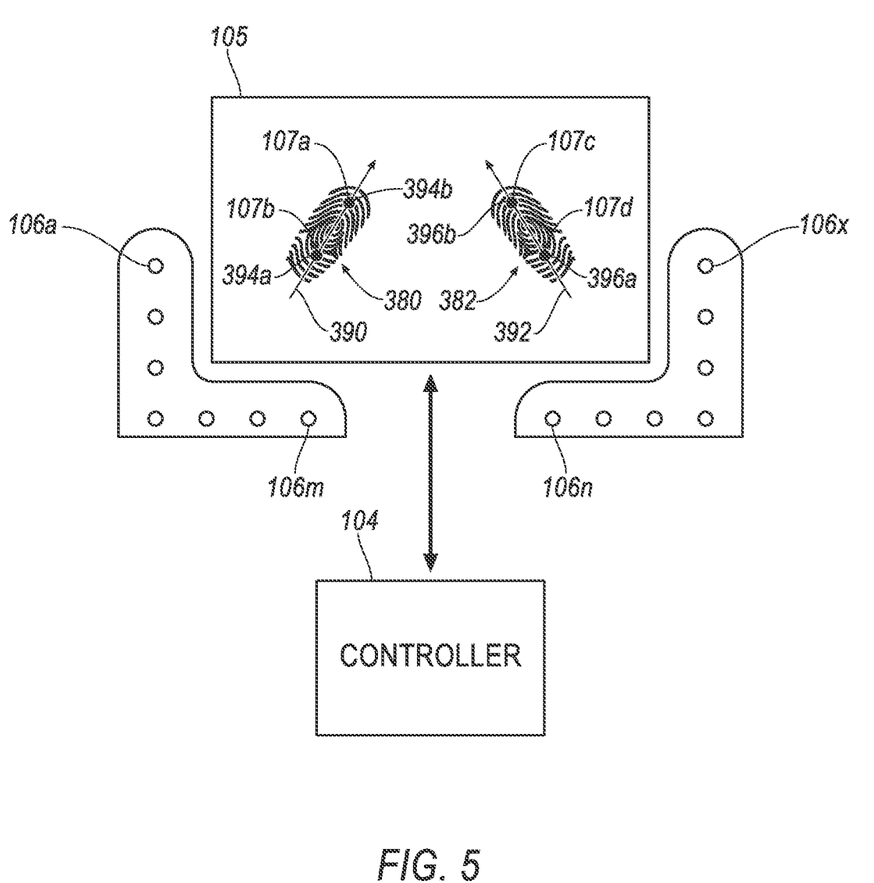
FIG. 5 depicts a detailed view of various contact points on a touch screen in accordance to one embodiment.

In operation 310, the controller 104 determines a slope for two or more contact points on the touch screen 105 based off of a single finger point as detected by the plurality of proximity sensors 107a-107b or 107c-107d. Reference is made to FIG. 5 for the manner in which the controller 104 determines the slope for two or more contact points of the touch screen 105 based off of the single finger point. For example, a first fingerprint 380 is illustrated on one side of the touch screen 105 and a second fingerprint 382 is illustrated on another side of the touch screen 105. Assuming for the sake of example that the plurality of proximity sensors 107a-107b detect two or more contact points 394a-394b, the coordinates of such points are provided to the controller 104 to calculate the slope of an axis 390. Likewise, assuming for example that the plurality of proximity sensors 107b-107c detect two or more contact points 396a-396b, the coordinates of such points are provided to the controller 104 to calculate the slope of an axis 392. It is recognized that only a typical user selection comprises a single touch. Therefore, only the first fingerprint 380 may be detected or only the second fingerprint 382 may be detected by the various proximity sensors. FIG. 5 depicts both the first fingerprint 380 and the second fingerprint 382 to illustrate the different slopes of the axis 390, 392, respectively. The controller 104 determines the slope of the axis 390 or the axis 392 based on the signals provided by the proximity sensors 107a-107b or 107c-107d to determine whether the slope is negative or positive. The first fingerprint 290 is provided to illustrate that the slope for the axis 390 for the first fingerprint 380 is positive. The second fingerprint 382 is provided to illustrate that the slope for the axis 392 for the second fingerprint 382 is negative.

Referring back to FIG. 4, in operation 312, the controller 104 determines whether the slope of the axis formed by the detected the contact points is negative. If the controller 104 determines that the slope as established via an axis formed through the contact points is negative, then the method 300 moves to operation 314. If not, the method 300 ends and determines that the position of the user is on the left side and is the driver of the vehicle 112. The first fingerprint 380 as illustrated in FIG. 5 depicts a positive slope for the axis 390 that is formed by the contact points 394a-394b which corresponds to the user being positioned on the left side of the touch screen 105 and the user being the driver.

In operation 314, the controller 104 determines that the slope formed by the contact points is negative. As noted above, the second fingerprint 382 as illustrated in FIG. 5 depicts a negative slope for axis 392 that is formed by the contact points 396a and 396b. Thus, in this case, the controller 104 determines that the user is on the right side of the touch screen 105 and is a passenger in the vehicle 112.

Figure 6:
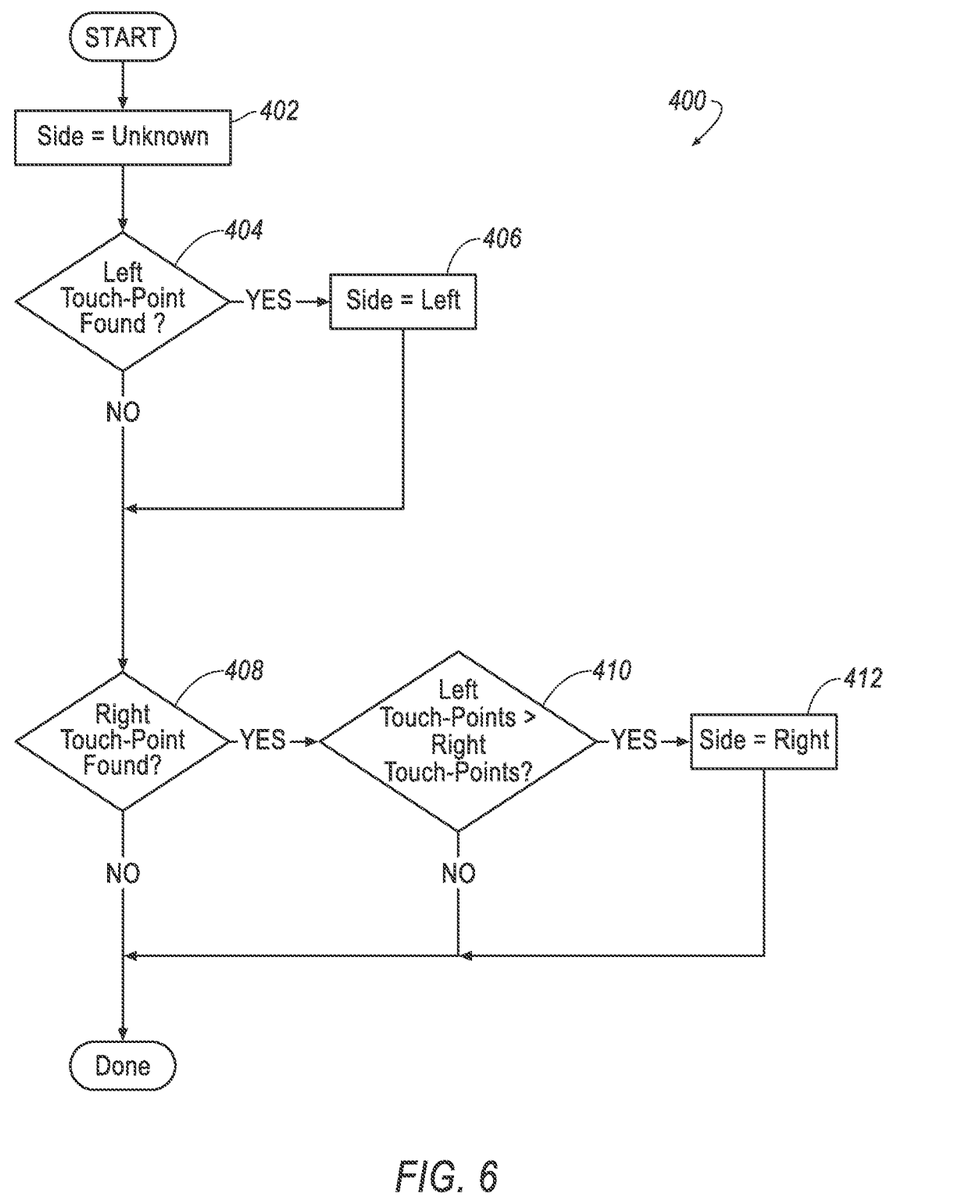
FIG. 6 depicts a third method for determining a location of a user relative to a user interface to provide contextual control in accordance to one embodiment.

FIG. 6 depicts a third method 400 for detecting a relative location of the user for a selection performed via the rotary knob 110 and/or the slider 108 in accordance to one embodiment.

In operation 402, the controller 104 is in a default state as the location of the user (i.e., the side) is not yet known after a selection has been performed by the slider 108 and/or the rotary knob 110.

In operation 404, the controller 104 determines whether contact with the slider 108 and/or the rotary knob 110 is on the left side of the slider 108 and/or the rotary knob 110 based on outputs provided by the proximity sensors 106a-106m. If this condition is true, then the method 400 moves to operation 406. If not, then the method 400 moves to operation 408.

In operation 406, the controller 104 determines that the contact with slider 108 and/or the rotary knob 110 based on outputs provided by the proximity sensors 106a-106m. In this case, the contact may correspond to the at least the thumb of the driver on the left side of the slider 108 and/or rotary knob 110. In this case, the controller 104 determines that the user is the driver.

In operation 408, the controller 104 determines whether contact with the slider 108 and/or the rotary knob 110 is on the right side of the slider 108 and/or the rotary knob 110 based on outputs provided by the proximity sensors 106n-106x. If this condition is true, then the method 400 moves to operation 410. If not, then the method 400 is complete and determines that the user is positioned on the left side of the slider 108 and/or the rotary knob 110.

In operation 410, the controller 104 determines whether the number of contacts on the right side of the slider 108 and/or the rotary knob 110 are greater then the number of contacts on the left side of the slider 108 and/or the rotary knob 110. If this condition is true, then the method 400 moves to operation 412 as it is assumed that a right-side user (e.g., a passenger) may place multiple fingers on the left side of the slider 108 and/or rotary knob 110 versus a single thumb on the right side. If not, then the method 400 is complete and determines that the user is positioned on the left side of the slider 108 and/or the rotary knob 110.

In operation 412, the controller 104 determines that the user is positioned on the right side of the slider 108 and/or the rotary knob 110. In this case, the controller 104 determines that the user is a passenger.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system comprising:
a user interface configured to enable selection of one or more operations for a vehicle;
a plurality of proximity sensors positioned about or within the user interface and being configured to transmit first signals indicative of a location of a user relative to the user interface as the user selects the one or more operations for the vehicle with the user interface; and
at least one controller configured to:
determine a location of the user relative to the user interface in response to the first signals;
transmit a vehicle control signal to a vehicle subsystem to perform the one or more operations based on the location of the user relative to the user interface;
detect a first touch point on a first side of the user interface based on a first output from a first proximity sensor;
detect a second touch point on a second side of the user interface that is opposite to the first side based on a second output from a second proximity sensor;
determine that the user is located on the first side if the first output is received prior to the second output; and
determine that the user is located on the second side if the second output is received prior to the first output.

2. The system of claim 1, wherein the user being located on the first side corresponds to the user being located on a driver side of the vehicle.

3. The system of claim 2, wherein the user being located on the second side corresponds to the user being located on a passenger side of the vehicle.

4. The system of claim 1, wherein the at least one controller is further configured to determine if more than one touch point has been selected on a touch screen of the user interface by the user based on the first signals, wherein the one touch point corresponds to a single finger press on the touch screen.

5. The system of claim 4, wherein the at least one controller is further configured to determine if more than two or more sub-points have been detected on the touch screen if only the one touch point has been selected on the touch screen by the user based on the first signals.

6. The system of claim 5, wherein the at least one controller is further configured to determine a slope of an axis that extends across two sub-points established on the touch screen if more than one sub-point has been detected on the touch screen.

7. The system of claim 6, wherein the at least one controller is further configured to determine whether the slope is negative or positive to determine the location of the user relative to the touch screen.

8. The system of claim 7, wherein the at least one controller is further configured to determine that the user is positioned on a first side of the touch screen and that the user is a driver of the vehicle based on the slope being positive.

9. The system of claim 8, wherein the at least one controller is further configured to determine that the user is positioned on a second side of the touch screen and that the driver is a passenger of the vehicle based on the slope being negative.

10. The system of claim 1, wherein the at least one controller is further configured to compare a first number of touch points occurring on the first side of the user interface to a second number of touch points occurring on the second side of the user interface.

11. The system of claim 10, wherein the at least one controller is further configured to determine that the user is positioned on the first side of user interface if the first number of touch points occurring on the first side of the user interface is greater than the second number of touch points occurring on the second side of the user interface.

12. A method comprising:
enabling a selection of one or more operations for a vehicle at a user interface;
transmitting first signals indicative of a location of a user relative to the user interface via a plurality of proximity sensors as a user selects the one or more operations for the vehicle with the user interface;
determining a location of the user relative to the user interface via at least one controller in response to the first signals;
transmitting a vehicle control signal to a vehicle subsystem with the at least one controller to perform the one or more operations based on the location of the user relative to the user interface;
detecting a first touch point on a first side of the user interface based on a first output from a first proximity sensor;
detecting a second touch point on a second side of the user interface that is opposite to the first side based on a second output from a second proximity sensor;
determining that the user is located on the first side if the first output is received prior to the second output; and
determining that the user is located on the second side if the second output is received prior to the first output.

13. A system comprising:
a user interface configured to enable selection of one or more operations;
a plurality of proximity sensors positioned about or within the user interface and being configured to transmit first signals indicative of a location of a user relative to the user interface as the user selects the one or more operations with the user interface; and
at least one controller configured to:
determine a location of the user relative to the user interface in response to the first signal;
transmit a control signal to a first controller to perform the one or more operations based on the location of the user relative to the user interface;
detect a first touch point on a first side of the user interface based on a first output from a first proximity sensor;
detect a second touch point on a second side of the user interface that is opposite to the first side based on a second output from a second proximity sensor;
determine that the user is located on the first side if the first output is received prior to the second output; and determine that the user is located on the second side if the second output is received prior to the first output.

14. The system of claim 13, wherein the at least one controller is further configured to determine if more than one touch point has been selected on a touch screen of the user interface by the user based on the first signals, wherein the one touch point corresponds to a single finger press on the touch screen.

15. The system of claim 14, wherein the at least one controller is further configured to determine if more than one sub-point has been detected on the touch screen if only the one touch point has been selected on the touch screen by the user based on the first signals.

16. The system of claim 15, wherein the at least one controller is further configured to determine a slope of an axis that extends across two sub-points established on the touch screen if more than one sub-point has been detected on the touch screen.

17. The system of claim 16, wherein the at least one controller is further configured to determine whether the slope is negative or positive to determine the location of the user relative to the touch screen.

* * * * *